United States Patent [19]

McGrath et al.

[11] Patent Number: 5,244,539
[45] Date of Patent: Sep. 14, 1993

[54] COMPOSITION AND METHOD FOR STRIPPING FILMS FROM PRINTED CIRCUIT BOARDS

[75] Inventors: Peter T. McGrath, Wendelstein, Fed. Rep. of Germany; Narendra K. Shah, Mission Viejo, Calif.

[73] Assignee: Ardrox, Inc., La Mirada, Calif.

[21] Appl. No.: 826,133

[22] Filed: Jan. 27, 1992

[51] Int. Cl.$^5$ .............. B44C 1/22; C23F 1/00; C09K 13/04; C09K 13/06
[52] U.S. Cl. ........................... 156/656; 134/2; 134/3; 156/664; 156/666; 156/903; 252/79.2; 252/79.3; 252/79.4
[58] Field of Search ............. 252/79.2, 79.3, 79.4, 252/142; 156/640, 656, 659.1, 664, 666, 901, 902, 903; 134/2, 3

[56] References Cited

U.S. PATENT DOCUMENTS

| | | | |
|---|---|---|---|
| 4,713,144 | 12/1987 | Schiller | 156/656 |
| 4,921,571 | 5/1990 | Kukanskis et al. | 156/656 |
| 4,957,653 | 9/1990 | Cordani | 252/79.3 X |
| 5,017,267 | 5/1991 | Cordani | 156/656 |
| 5,035,749 | 7/1991 | Haruta et al. | 252/79.4 X |

FOREIGN PATENT DOCUMENTS

| | | |
|---|---|---|
| 2421313 | 11/1974 | Fed. Rep. of Germany . |
| 58-58280 | 4/1983 | Japan . |
| 2212112 | 7/1989 | United Kingdom . |

*Primary Examiner*—William A. Powell
*Attorney, Agent, or Firm*—Harris, Kern, Wallen & Tinsley

[57] ABSTRACT

A metal dissolving liquid and method for stripping solder and the underlying tin-copper alloy from the copper substrate of a printed circuit board, including an aqueous solution of nitric acid in an amount sufficient to dissolve solder and tin, a source of ferric ions in an amount sufficient to dissolve tin-copper alloy, a source of halide ions in an amount sufficient to solubilize tin, and a source of ammonium ions in an amount sufficient, in combination with the halide ions, to solubilize the tin and substantially eliminate sludge formation, reduce attack on the copper substrate and provide a bright copper finish after solder removal. A liquid further including benzotriazole and urea in amounts not more than about 2% by weight of each. The liquid wherein the source of ammonium ions includes ammonium bicarbonate.

36 Claims, No Drawings

COMPOSITION AND METHOD FOR STRIPPING FILMS FROM PRINTED CIRCUIT BOARDS

BACKGROUND OF THE INVENTION

This invention relates to the removal of solder films from printed circuit boards and in particular, to a new and improved method and composition for stripping the solder film and the underlying tin-copper alloy from the copper substrate of a printed circuit board in a single application of the composition, as by spraying or dipping, without the formation of sludge.

A typical printed circuit board has a copper conductor pattern on an insulating support. Solder is applied onto the copper substrate, typically by electroplating. The solder film typically is in the order of 0.0003 inches thick which is the standard thickness used in most present day processes. This is a nominal value, for the thickness may vary considerably over the board and from board to board. After the solder film is applied onto the copper, a thin film of copper-tin alloy forms between the copper and the solder, typically about 0.000002 to 0.000004 inches thick. This copper-tin alloy film increases in thickness with time.

As used in the specification and claims, the word "solder" includes the various tin-lead alloys and substantially pure tin as used in providing films on printed circuit boards. Such films are produced by various methods, including electroplating, chemical deposition and immersion in a melt. While the 60-40 tin-lead solder film typically is about 0.0003 to 0.0004 inches thick, the pure tin film typically is about 0.0002 inches thick. The film is used as a resist over the copper during etching of the copper in the production of solder mask over bare copper boards.

In the manufacturing process the solder film is stripped from the copper substrate. Two types of compositions have been used for this solder stripping in the past. One composition is an acid solution of hydrogen peroxide and a fluoride. The other stripper is a nitric acid solution inhibited so that it will not attack copper. In general, the nitric acid based solder strippers are superior to the peroxide-fluoride based strippers, and have been used commercially for a number of years.

The peroxide-fluoride compositions are undesirable because there is an exothermic reaction during the stripping which heats the solution to a temperature which decomposes the unstable peroxide and makes the solution unusable. Hence the solution requires cooling during use. Also, the peroxidefluoride solutions attack the epoxy fiberglass substrate and are very difficult to waste treat because of their chelating/complexing properties and toxicity. Nitric acid based solutions do not exhibit these problems.

In earlier conventional nitric acid stripper systems, the nitric acid solution is maintained in a tank and the board is immersed in the solution for a period of time required to dissolve the solder. Following removal of the solder, it is necessary to remove the tin-copper alloy layer to expose the copper substrate. This is achieved by then immersing the board in a second tank containing another solution which dissolves the tin-copper alloy and ordinarily a small amount of the pure copper substrate. This second solution may be for example, ferric chloride, ammonium persulfate, peroxide sulfuric acid, or peroxide-fluoride.

The basic composition and method for single bath and spray stripping is now well described in prior art patents. A number of results are desired in the solder stripping operation, including complete stripping in a minimum time, a resultant bright surface on the exposed copper, a minimum of foaming and fuming, all without the formation of sludge in the stripper tank. It has not been possible to achieve all these results with the prior stripping compositions, and it is an object of the present invention to provide a new and improved composition and method for stripping which provides complete stripping with a resulting bright surface, in a short time, without foaming or fuming, and substantially without formation of sludge which needs to be removed before charging the process tank with fresh solution.

The composition of U.S. Pat. No. 4,713,144 utilizes a combination of nitric, ferric and sulfamic acid which operates satisfactorily for stripping in a relatively short time, but did result in relatively high tin rich sludge. Formulations containing organic acids have been tried to solve the sludge problem but were not satisfactory in that they only delayed the sludge formation and at the same time were very unstable. The organic acid bearing strippers yielded colloidal sludge in the absence of sulfamic acid but did not perform well in the presence of sulfamic acid. Also, various inhibitors have been tried in an effort to improve performance. By way of example see Japanese patent disclosure 58 (1983)-58280 and U.S. Pat. No. 4,921,571 and patents discussed therein.

Another known formulation avoids the formation of sludge but does not provide a clean bright copper surface, while at the same time producing fumes which have to be taken care of.

It is an object of the present invention to provide a new and improved stripping composition and method of stripping which utilizes only a single composition and a single application step and which achieves the desired bright surface of the cleaned copper, while substantially eliminating the production of the undesirable sludge which accompanies prior stripping operations.

By way of example, in the past it usually has been necessary to shut down the stripping operation after about two days in order to remove the accumulated sludge from the stripping tank. With the composition of the present invention, it is now possible to operate the same equipment for two weeks without requiring shut down, and in some situations the equipment can be operated continuously using the feed and bleed method of maintaining composition strength, without interrupting operation for sludge removal.

It is a further object of the invention to provide such a stripping composition and method which can utilize conventional inhibitors for reduction of fumes and reduction of foaming, without adversely affecting the operation or life of the basic composition.

These and other objects, advantages, features and results will more fully appear in the course of the following description.

SUMMARY OF THE INVENTION

A metal dissolving liquid for stripping solder and the underlying tin-copper alloy from the copper substrate of a printed circuit board, including an aqueous solution of nitric acid in an amount sufficient to dissolve solder and tin, a source of ferric ions in an amount sufficient to dissolve tin-copper alloy, a source of halide ions in an amount sufficient to solubilize tin, and a source of ammonium ions in an amount sufficient, in combination with the halide ions, to solubilize the tin and substantially eliminate sludge formation, reduce attack on the copper substrate and provide a bright copper finish after solder removal.

It is a particular feature of the invention to use a combination of halide ions and ammonium ions in the stripping solution for sludge reduction without introducing other adverse results.

A liquid further including a material selected from the group consisting of benzotriazole, tolytriazole and combinations thereof in an amount not more than about 2% by weight of the liquid, and urea in an amount not more than about 2% by weight of the liquid.

More specifically a liquid including an aqueous solution of about 25 to 45 weight percent of nitric acid (67%) aqueous solution, about 0.5 to 15 weight percent of a ferric ion source, about 0.5 to 6 weight percent of a halide ion source, and about 0.05 to 12 weight percent of an ammonium ion source.

A method comprising providing such a liquid and applying it to a printed circuit board, preferably by spraying directly onto the board.

DESCRIPTION OF THE PREFERRED EMBODIMENTS

The basic composition of the invention is an aqueous solution with nitric acid, a source of ferric ions, typically ferric nitrate, a source of halide ions, typically hydrochloric acid, and a source of ammonium ions, typically ammonium bicarbonate. The combination of these constituents in the ranges set forth produces the desired stripping result in an economical time without production of a significant amount of sludge. The composition is not sensitive in the sense that a conventional surfactants, defoaming agents, and antifume agents can be utilized in small quantities without adversely affecting the operation of the composition.

In operation, the nitric acid functions to dissolve the solder and tin by a reaction with the lead and tin of the solder. During the manufacture of the printed circuit board, some of the tin of the solder usually forms an alloy with the upper surface of the copper. The ferric ions function to dissolve this tin-copper alloy and expose the pure copper of the film. The halide ions function to solubilize the tin to prevent sludge formation. It has been found that the use of ammonium ions in combination with the nitric acid, ferric ions and halide ions substantially eliminates sludge formation by preventing formation of metastannic acid. The function of the ammonium ions is not fully understood but it appears that the ammonium ion compliments the halide ions working together in solubilizing tin, buffering/reducing attack on the copper substrate by the nitric acid, and brightening the copper to a bright, preferably mirror, finish after the removal of the solder or tin coating.

The specific magnitudes of each of these constituents in the dissolving liquid are not critical, so long as the desired functions can be achieved. The tests set out in the Table below indicate the ranges which will produce an acceptable stripping composition.

In a typical commercial installation, the boards to be stripped are transported by conveyor through a spray booth having one or more spray heads. The stripping solution is continuously recirculated from the sump of the booth to the spray heads. The speed of the conveyor is varied to obtain the desired removal of the material from the board. In time the efficiency of the stripping solution is reduced, the time required for removal of the solder film increases, and the conveyor speed is reduced. When the time required for removal becomes too long for economical operation, the stripping solution in the bath is replaced by a fresh quantity of stripping solution. This replacement may occur weekly or daily or at shorter intervals, depending upon the size of the booth, the amount of material to be removed and the production rate.

In the past when the operation was shut down for replacement of the stripping liquid, sludge was removed from the sump or tank. In contrast, with the composition of the present invention, the strength of the solution can be maintained by feed and bleed without requiring any shut down for replacement of solution or for sludge removal.

Nitric acid is commercially available as a 67% by weight aqueous solution of $HNO_3$. For ease of preparation, the nitric acid content will be expressed as percent by weight percent of a 67% nitric acid solution.

Ferric nitrate is obtainable commercially as crystals of $Fe(NO_3)_3.9H_2O$ and as an aqueous solution containing 45% by weight of anhydrous $Fe(NO_3)_3$. The concentration of ferric nitrate in the subject compositions may be expressed as grams per liter of $Fe(NO_3)_3.9H_2O$, weight percent of $Fe(NO_3)_3.9H_2O$, grams per liter of anhydrous $Fe(NO_3)_3$, weight percent anhydrous $Fe(NO_3)_3$ or as a weight percent of the 45% $Fe(NO_3)_3$ aqueous solution. For simplicity we prefer weight percent of $Fe(NO_3)_3.9H_2O$.

Other sources of ferric ions include ferric chloride, ferric acetate, ferric hydroxide, ferric lactate, ferric oxide, and non sulfur bearing water soluble ferric salts of organic and inorganic nature.

Halide ions may be obtained from various sources, including HCl, HF, HBr, HI, $NH_4Cl$, $FeCl_3$, and combinations thereof. Typically hydrochloric acid is utilized. When ferric chloride is used as a source of ferric ions, chloride ions are also provided. Similarly when ammonium chloride is used as a source of ammonium ions, chloride ions are also provided. In the preferred composition, urea is utilized to provide ammonia as well as to minimize the formation of nitrogen monoxide, nitrogen dioxide and nitrogen trioxide.

Many sources of ammonium ions are available including ammonium hydroxide, ammonium acetate, ammonium benzoate, ammonium bicarbonate, ammonium bifluoride, ammonium bitartrate, ammonium borate, ammonium bromide, ammonium carbomate, ammonium carbonate, ammonium ceric nitrate, ammonium chloride, ammonium citrate, ammonium cupric chloride, ammonium ferric citrate, ammonium ferric oxalate, ammonium ferric tartrate, ammonium fluoride, ammonium formate, ammonium iodide, ammonium lactate, ammonium nitrate, ammonium oxalate, ammonium salicylate, ammonium tartrate, urea, and combinations thereof, with ammonium bicarbonate being the presently preferred source.

Suitable surfactants include any non ionic, anionic, cationic or amphoteric type, suitable defoaming agents include any non silicones, petroleum based type, and suitable antifume agents include urea as well as non sulphur bearing nitrogen compounds.

In the Table and the claims, the amount of nitric acid is expressed in terms of 67% nitric acid and the amount of ferric acid is expressed in terms of ferric nitrate non hydrate crystals. These particular combinations have been used because these materials are commonly sold and used in such concentrations. However, it will be recognized by those skilled in the art that other concentrations, including the anhydrous state, can be used if desired, and that the figures stated for the compositions can readily be converted to other figures for other concentrations.

The preferred ranges for the four functional components of the stripper are about:

Nitric Acid—25 to 45 weight percent of 67% nitric acid aqueous solution,

Ferric Ions—0.5 to 15 weight percent of a ferric ion source,

Halide Ions—0.5 to 6 weight percent of a halide ion source,

Ammonium Ions—0.05 to 12 weight percent of an ammonium ion source.

The more preferred ranges are about:

Nitric Acid—30 to 35 weight percent of 67% nitric acid aqueous solution,

Ferric Nitrate—5 to 10 weight percent of 45% ferric nitrate aqueous solution,

Hydrochloric Acid—0.5 to 2 weight percent of hydrochloric acid, and

Ammonium Bicarbonate—0.5 to 12 weight percent of ammonium bicarbonate

The preferred liquid also includes benzotriazole, tolytriazole or a combination thereof in an amount no more than about 2% by weight of the liquid. Also, urea may be used in an amount no more than about 2% by weight of the liquid.

The presently preferred composition in weight percent is:

| | |
|---|---|
| Deiozed Water | 54.2 |
| HNO$_3$ (67%) | 32.4 |
| Ammonium Bicarbonate | 1.5 |
| Fe(NO$_3$)$_2$.9H$_2$O | 8.4 |
| Benzotriazole | 1.6 |
| Hcl | 1.0 |
| Ammonium Chloride | 1.4 |
| Urea | 0.4 |

Tests were conducted by immersing samples of solder plated and tin plated circuit boards while varying the concentrations of nitric acid, ammonium bicarbonate, ferric nitrate, hydrochloric acid and benzotriazole over a wide range of concentration. The thickness of solder was nominally 0.00025 inches and the composition of solder nominally 60% tin-40% lead. These samples were already subjected to plating-resist stripping, copper etching and solder conditioning. Same description applies to tin plated samples. Tin was nominally 0.0002 inches.

For etch rate on copper 1"×1" solid copper coupons were used. Etch rate was determined by weight loss study. Copper surface appearance was determined on individual solder or tin coupons after stripping in a given test formulation. Test solutions were 200 ml each at 75° F. To study sludge formation the equivalent of 112.5 g/l of solder or tin was dissolved and at the end of the test visually analyzed for tin sludge. The sludge would consist of insoluble tin dioxide. In a given experiment the following observations were recorded.

1. Solder or tin stripping time
2. Appearance of copper substrate
3. Sludge formation
4. Etch rate on copper
5. Temperature rise during solder or tin stripping.

The same criteria applied to these experimental tests in a spray mode using a DYNAMIL-VRP-50 machine.

The following Table sets out the results of a series of tests carried out to determine suitable limits for the stripping composition of the invention. In the Table, ABC is ammonium bicarbonate and BTZ is benzotriazole. The constituents are set out in percent by weight.

The finished appearance of the copper, the etch rate and strip time, and the absence of sludge are the prime factors in determining an acceptable composition. The composition of Tests Nos. 16–20, 22, 23, 29, 33, 34 and 38–40 are preferred; 15, 24, 25, 28, 32 and 35 are acceptable; and the remainder are unacceptable.

Tests 1 through 7 were to determine the effect of variation in Cl− (as HCl) ion in absence of NH$_4$+ (as NH$_4$HCO$_3$). Tests 8 through 14 were to determine the effect of variation in NH$_4$+ ions (as NH$_4$HCO$_3$) in absence of Cl− (as HCl). Tests 15 through 20 were to determine the effect of variation in NH$_4$+ ions (as NH$_4$HCO$_3$) concentration in presence of Cl− (as HCl). Tests 21 through 26 were to determine the effect of variation in Cl− ions as (HCl) concentration in presence of NH$_4$+ ions (as NH$_4$HCO$_3$). Tests 27 through 31 were to determine the effect of variation in nitric acid concentration in presence of NH$_4$+, Cl−, ferric ions and benzotriazole. Tests 32 through 37 were to determine the effect of variation in ferric ions (as FE(HNO$_3$)$_2$.9H$_2$O) in presence of HNO$_3$, HCl, NH$_4$HCO$_3$ and benzotriazole. Tests 38 through 43 were to determine the effect of variation in benzotriazole concentration in presence of HNO$_3$, HCl, FE(HNO$_3$)$_2$.9H$_2$O and NH$_4$HCO$_3$. Test 38 with 0.1 percent BTZ is essentially no BTZ, and shows that the absence of BTZ does not adversely affect the performance of the composition. The BTZ is used as a conventional inhibitor of attack on copper.

| TEST NO. | (1) | (2) | (3) | (4) | (5) | (6) | (7) | (8) | (9) |
|---|---|---|---|---|---|---|---|---|---|
| WATER, D.I. | 57.6 | 57.5 | 57.1 | 56.1 | 54.6 | 51.6 | 47.6 | 57.5 | 57.1 |
| $HNO_3$ (67%) | 32.4 | 32.4 | 32.4 | 32.4 | 32.4 | 32.4 | 32.4 | 32.4 | 32.4 |
| ABC | — | — | — | — | — | — | — | 0.1 | 0.5 |
| $Fe(NO_3)_2 \cdot 9H_2O$ | 8.4 | 8.4 | 8.4 | 8.4 | 8.4 | 8.4 | 8.4 | 8.4 | 8.4 |
| BTZ | 1.6 | 1.6 | 1.6 | 1.6 | 1.6 | 1.6 | 1.6 | 1.6 | 1.6 |
| HCl | 0 | 0.1 | 0.5 | 1.5 | 3.0 | 6.0 | 10.0 | — | — |
| SAMPLE COMMENTS | CLEAR | CLEAR | CLEAR | CLEAR | CLEAR | CLEAR | CLEAR | CLEAR | CLEAR |
| COPPER APPEARANCE | MATT | MATT-DULL | MATT-BRIGHT | BRIGHT | VERY BRIGHT | MATT WITH TARNISH | MATT TARNISH | MATT-STREAKY | INCOMPLETE STRIP Sn/Pb DULL |
| (75° F.) CU. ETCH RATE μIN/MIN. | 66 | 58 | 39 | 43.5 | 40.2 | 49.8 | 85.5 | 68 | 94.7 |
| (75° F.) STRIP TIME Sn/Pb MIN-SECONDS | 7 M - 5 SEC | 1 M - 54 SEC | 1 M - 46 SEC | 1 M - 48 SEC | 2 M - 0 SEC | 2 M - 0 SEC | 1 M - 36 SEC | 3 M - 30 SEC | 7 M - 50 SEC |
| (24 HRS) SLUDGE Sn/Pb | YES HEAVY | YES HEAVY | NONE | NONE | NONE | NONE | YES MODERATE | YES HEAVY | YES HEAVY |
| TEMP RISE DURING INITIAL REACTION WITH Sn/Pb FROM 80° F. T°F. | — | — | — | — | — | — | — | — | — |
| REACTION WITH Sn/Pb T°F. | 10° | 15° | 18° | 23° | 25° | 27° | 30° | 10° | 13° |

| TEST NO. | (10) | (11) | (12) | (13) | (14) | (15) | (16) | (17) |
|---|---|---|---|---|---|---|---|---|
| WATER, D.I. | 56.1 | 54.6 | 51.6 | 48.6 | 45.6 | 56.55 | 56.05 | 55.05 |
| $HNO_3$ (67%) | 32.4 | 32.4 | 32.4 | 32.4 | 32.4 | 32.4 | 32.4 | 32.4 |
| ABC | 1.5 | 3.0 | 6.0 | 9.0 | 12.0 | 0.05 | 0.5 | 1.5 |
| $Fe(NO_3)_2 \cdot 9H_2O$ | 8.4 | 8.4 | 8.4 | 8.4 | 8.4 | 8.4 | 8.4 | 8.4 |
| BTZ | 1.6 | 1.6 | 1.6 | 1.6 | 1.6 | 1.6 | 1.6 | 1.6 |
| HCl | — | — | — | — | — | 1.0 | 1.0 | 1.0 |
| SAMPLE COMMENTS | CLEAR | CLEAR | BTZ CRYSTAL | BTZ CRYSTAL | BTZ CRYSTAL | BTZ CRYSTAL (SLIGHT) | BTZ CRYSTAL (SLIGHT) | BTZ CRYSTAL (SLIGHT) |
| COPPER APPEARANCE | INCOMPLETE STRIP Sn/Pb DULL | INCOMPLETE STRIP Sn/Pb DULL | INCOMPLETE STRIP Sn/Pb DULL | INCOMPLETE STRIP Sn/Pb DULL | INCOMPLETE STRIP Sn/Pb DULL | BRIGHT SOME STREAK | VERY SLIGHT | MIRROR BRIGHT |
| (75° F.) CU. ETCH RATE μIN/MIN | 57.1 | 32 | 20.9 | 13.9 | 26.7 | 45.8 | 41.9 | 81 |
| (75° F.) STRIP TIME Sn/Pb MIN-SECONDS | 7 M - 56 SEC | 10 M - 0 SEC | 10 M - 0 SEC | 10 M - 0 SEC | 10 M - 0 SEC | 2 M - 10 SEC | 1 M - 58 SEC | 1 M - 46 SEC |
| (24 HRS) SLUDGE Sn/Pb | YES HEAVY | YES HEAVY | YES HEAVY | YES MODERATE | VERY SLIGHT | VERY SLIGHT TO NONE | VERY SLIGHT TO NONE | VERY SLIGHT TO NONE |
| REACTION WITH Sn/Pb T°F. | 16° | 20° | 22° | 24° | 26° | 28° | 30° | 32° |

| TEST NO. | (18) | (19) | (20) | (21) | (22) | (23) | (24) |
|---|---|---|---|---|---|---|---|
| WATER, D.I. | 53.55 | 50.55 | 44.55 | 55.55 | 55.10 | 54.10 | 52.60 |
| $HNO_3$ (67%) | 32.4 | 32.4 | 32.4 | 32.4 | 32.4 | 32.4 | 32.4 |
| ABC | 3.0 | 6.0 | 12.0 | 2.0 | 2.0 | 2.0 | 2.0 |
| $Fe(NO_3)_2 \cdot 9H_2O$ | 8.4 | 8.4 | 8.4 | 8.4 | 8.4 | 8.4 | 8.4 |
| BTZ | 1.6 | 1.6 | 1.6 | 1.6 | 1.6 | 1.6 | 1.6 |
| HCl | 1.0 | 1.0 | 1.0 | 0.05 | 0.5 | 1.5 | 3.0 |
| SAMPLE COMMENTS | BTZ CRYSTAL (SLIGHT) | BTZ CRYSTAL (SLIGHT) | BTZ CRYSTAL (SLIGHT) | BTZ CRYSTAL (SLIGHT) | BTZ CRYSTAL (SLIGHT) | BTZ CRYSTAL (SLIGHT) | BTZ CRYSTAL (SLIGHT) |

-continued

| TEST NO. | (25) | (26) | (27) | (28) | (29) | (30) | (31) | (32) |
|---|---|---|---|---|---|---|---|---|
| COPPER APPEARANCE | MIRROR FINISH WITH SOME STREAKS | MIRROR FINISH SOME STREAKS | MIRROR FINISH SOME STREAKS | MIRROR BRIGHT SOME TARNISH | MIRROR BRIGHT SOME TARNISH | MIRROR BRIGHT | MIRROR BRIGHT SLIGHT MATT | MATT TO MIRROR FINISH |
| (75° F.) CU. ETCH RATE μIN/MIN | 24.8 | 37 | 40.5 | 40 | 40 | 36.7 | 35 | 26.3 |
| (75° F.) STRIP TIME Sn/Pb MIN-SECONDS | 1 M - 49 SEC | 2 M - 10 SEC | 2 M - 17 SEC | 2 M - 50 SEC | 2 M - 50 SEC | 3 M - 0 SEC | 2 M - 30 SEC | 2 M - 17 SEC |
| (24 HRS) SLUDGE Sn/Pb | VERY SLIGHT TO NONE | VERY SLIGHT TO NONE | NONE | VERY MODERATE | VERY MODERATE | VERY SLIGHT TO NONE | VERY SLIGHT TO NONE | VERY SLIGHT TO NONE |
| REACTION WITH Sn/Pb T °F. | 30° | 30° | 32° | 25° | 25° | 30° | 35° | 40° |

| TEST NO. | (25) | (26) | (27) | (28) | (29) | (30) | (31) | (32) |
|---|---|---|---|---|---|---|---|---|
| WATER, D.I. | 49.6 | 43.6 | 42 | 52 | 62 | 72 | 82 | 61.9 |
| HNO₃ (67%) | 32.4 | 32.4 | 45 | 35 | 25 | 15 | 5 | 33 |
| ABC | 2.0 | 2.0 | 2.0 | 2.0 | 2.0 | 2.0 | 2.0 | 2.0 |
| Fe(NO₃)₂·9H₂O | 8.4 | 8.4 | 8.4 | 8.4 | 8.4 | 8.4 | 8.4 | 0.5 |
| BTZ | 1.6 | 1.6 | 1.6 | 1.6 | 1.6 | 1.6 | 1.6 | 1.6 |
| HCl | 6.0 | 12.0 | 1.0 | 1.0 | 1.0 | 1.0 | 1.0 | 1.0 |
| SAMPLE COMMENTS | BTZ CRYSTAL (SLIGHT) | CLEAR | CLEAR | BTZ CRYSTAL (SLIGHT) BRIGHT SOME STREAK | BTZ CRYSTAL (SLIGHT) MIRROR FINISH | CLEAR | CLEAR | CLEAR |
| COPPER APPEARANCE | SEVERE TARNISH-BROWN | SEVERE TARNISH | MIRROR FINISH | VERY SLIGHT TO NONE | MIRROR FINISH | MIRROR FINISH | INCOMPLETE Sn/Pb | MIRROR FINISH SOME DULL |
| (75° F.) CU. ETCH RATE μIN/MIN | 41.5 | 100.5 | 35.0 | 38.6 | 4.8 | 2.7 | 0.88 | 7.4 |
| (75° F.) STRIP TIME Sn/Pb MIN-SECONDS | 2 M - 16 SEC | 2 M - 18 SEC | 1 M - 10 SEC | 1 M - 20 SEC | 2 M - 50 SEC | 5 M - 55 SEC | 12 M - 0 SEC | 5 M - 58 SEC |
| (24 HRS) SLUDGE Sn/Pb | VERY SLIGHT TO NONE | SLIGHT | YES MODERATE | VERY SLIGHT TO NONE | NONE | SLIGHT TO MODERATE | SLIGHT TO MODERATE | NONE |
| REACTION WITH Sn/Pb T °F. | 45° | 48° | 30° | 28° | 26° | 18° | 8° | 26° |

| TEST NO. | (33) | (34) | (35) | (36) | (37) | (38) | (39) |
|---|---|---|---|---|---|---|---|
| WATER, D.I. | 57.4 | 52.4 | 47.4 | 42.4 | 37.4 | 55.5 | 55.1 |
| HNO₃ (67%) | 33 | 33 | 33 | 33 | 33 | 33 | 33 |
| ABC | 2.0 | 2.0 | 2.0 | 2.0 | 2.0 | 2.0 | 2.0 |
| Fe(NO₃)₂·9H₂O | 5 | 10 | 15 | 20 | 25 | 8.4 | 8.4 |
| BTZ | 1.6 | 1.6 | 1.6 | 1.6 | 1.6 | 0.1 | 0.5 |
| HCl | 1.0 | 1.0 | 1.0 | 1.0 | 1.0 | 1.0 | 1.0 |
| SAMPLE COMMENTS | CLEAR | BTZ CRYSTAL (SLIGHT) | BTZ CRYSTAL (SLIGHT) | EXCESS BTZ CRYSTALLIZATION | EXCESS BTZ CRYSTALLIZATION | CLEAR | CLEAR |
| COPPER APPEARANCE | MIRROR FINISH SOME STREAK | MIRROR FINISH SOME DULL AREA | MIRROR FINISH SOME STREAK | — | — | MIRROR FINISH SOME STREAKS | MIRROR FINISH SOME STREAKS |
| (75° F.) CU. ETCH RATE μIN/MIN | 21 | 49.3 | 137 | — | — | 34.2 | 20.2 |
| (75° F.) STRIP TIME Sn/Pb MIN-SECONDS | 3 M - 20 SEC | 1 M - 28 SEC | 1 M - 10 SEC | — | — | 2 M - 38 SEC | 2 M - 27 SEC |
| (24 HRS) SLUDGE Sn/Pb | TRACE | TRACE | NONE | — | — | NONE | NONE |
| REACTION WITH Sn/Pb T °F. | 28° | 26° | 26° | — | — | 22° | 22° |

-continued

| TEST NO. | (40) | (41) | (42) | (43) |
|---|---|---|---|---|
| WATER, D.I. | 54.1 | 53.1 | 50.6 | 47.6 |
| $HNO_3$ (67%) | 33 | 33 | 33 | 33 |
| ABC | 2.0 | 2.0 | 2.0 | 2.0 |
| $Fe(NO_3)_2 \cdot 9H_2O$ | 8.4 | 8.4 | 8.4 | 8.4 |
| BTZ | 1.5 | 2.5 | 5.0 | 8.0 |
| HCl | 1.0 | 1.0 | 1.0 | 1.0 |
| SAMPLE COMMENTS | LIGHT BTZ CRYSTAL | EXCESS BTZ CRYSTALLIZATION | EXCESS BTZ CRYSTALLIZATION | EXCESS BTZ CRYSTALLIZATION |
| COPPER APPEARANCE | MIRROR FINISH SOME STREAKS | — | — | — |
| (75° F.) CU. ETCH RATE μIN/MIN | 35.1 | — | — | — |
| (75° F.) STRIP TIME Sn/Pb MIN-SECONDS | 2 M - 5 SEC | — | — | — |
| (24 HRS) SLUDGE Sn/Pb | SLIGHT | — | — | — |
| REACTION WITH Sn/Pb  T °F. | 22° | — | — | — |

We claim:

1. A metal dissolving liquid for stripping solder and the underlying tin-copper alloy from the copper substrate of a printed circuit board, including in combination:
   an aqueous solution of nitric acid in an amount sufficient to dissolve solder and tin;
   a source of ferric ions in an amount sufficient to dissolve tin-copper alloy;
   a source of halide ions in an amount sufficient to solubilize tin; and
   a source of ammonium ions in an amount sufficient, in combination with said halide ions, to solubilize said tin and substantially eliminate sludge formation, reduce attack on said copper substrate and provide a bright copper finish after solder removal.

2. A liquid as defined in claim 1 including a material selected from the group consisting of benzotriazole, tolytriazole and combinations thereof in an amount not more than about 2% by weight of the liquid.

3. A liquid as defined in claim 2 including urea in an amount not more than about 2% by weight of the liquid.

4. A liquid as defined in claim 3 wherein said source of ammonium ions includes ammonium bicarbonate.

5. A liquid as defined in claim 1 wherein said source of halide ions is selected from the group consisting of HCl, HF, HBr, HI, NH$_4$Cl, FeCl$_3$, and combinations thereof.

6. A liquid as defined in claim 5 wherein said source of ammonium ions is selected from the group consisting of ammonium hydroxide, ammonium acetate, ammonium benzoate, ammonium bicarbonate, ammonium bifluoride, ammonium bitartrate, ammonium borate, ammonium bromide, ammonium carbomate, ammonium carbonate, ammonium ceric nitrate, ammonium chloride, ammonium citrate, ammonium cupric chloride, ammonium ferric citrate, ammonium ferric oxalate, ammonium ferric tartrate, ammonium fluoride, ammonium formate, ammonium iodide, ammonium lactate, ammonium nitrate, ammonium oxalate, ammonium salicylate, ammonium tartrate, urea, and combinations thereof.

7. A liquid as defined in claim 6 wherein said source of ferric ions is selected from the group consisting of ferric nitrate, ferric chloride, ferric acetate, ferric hydroxide, ferric lactate, ferric oxide and non sulfur bearing water soluble ferric salts of organic and inorganic nature.

8. A metal dissolving liquid for stripping solder and the underlying tin-copper alloy from the copper substrate of a printed circuit board, including an aqueous solution of
   about 25 to 45 weight percent of 67% nitric acid aqueous solution,
   about 0.5 to 15 weight percent of a ferric ion source,
   about 0.5 to 6 weight percent of a halide ion source, and
   about 0.05 to 12 weight percent of an ammonium ion source.

9. A liquid as defined in claim 8 including a material selected from the group consisting of benzotriazole, tolytriazole and combinations thereof in an amount not more than about 2% by weight of the liquid.

10. A liquid as defined in claim 9 including urea in an amount not more than about 2% by weight of the liquid.

11. A liquid as defined in claim 10 wherein said source of ammonium ions includes ammonium bicarbonate.

12. A liquid as defined in claim 8 wherein said source of halide ions is selected from the group consisting of HCl, HF, HBr, HI, NH$_4$Cl, FeCl$_3$, and combinations thereof.

13. A liquid as defined in claim 12 wherein said source of ammonium ions is selected from the group consisting of ammonium hydroxide, ammonium acetate, ammonium benzoate, ammonium bicarbonate, ammonium bifluoride, ammonium bitartrate, ammonium borate, ammonium bromide, ammonium carbomate, ammonium carbonate, ammonium ceric nitrate, ammonium chloride, ammonium citrate, ammonium cupric chloride, ammonium ferric citrate, ammonium ferric oxalate, ammonium ferric tartrate, ammonium fluoride, ammonium formate, ammonium iodide, ammonium lactate, ammonium nitrate, ammonium oxalate, ammonium salicylate, ammonium tartrate, urea, and combinations thereof.

14. A liquid as defined in claim 13 wherein said source of ferric ions is selected from the group consisting of ferric nitrate, ferric chloride, ferric acetate, ferric hydroxide, ferric lactate, ferric oxide, and all non sulphur bearing water soluble ferric salts of organic and inorganic nature.

15. A metal dissolving liquid for stripping solder and the underlying tin-copper alloy from the copper substrate of a printed circuit board, including an aqueous solution of
   about 25 to 45 weight percent of 67% nitric acid aqueous solution,
   about 0.5 to 15 weight percent of 45% ferric nitrate aqueous solution,
   about 0.5 to 6 weight percent of a halide ion source, and
   about 0 05 to 12 weight percent of an ammonium ion source.

16. A metal dissolving liquid for stripping solder and the underlying tin-copper from the copper substrate of a printed / circuit board, including an aqueous solution of
   about 30 to 35 weight percent of 67% nitric acid aqueous solution,
   about 5 to 10 weight percent of 45% ferric nitrate aqueous solution,
   about 0.5 to 2 weight percent of hydrochloric acid, and
   about 0.5 to 12 weight percent of ammonium bicarbonate.

17. A liquid as defined in claim 16 including about 0.05 to 2 weight percent of benzotriazole.

18. A liquid as defined in claim 17 including about 0.05 to 2 weight percent urea.

19. In a method of stripping solder and the underlying tin-copper alloy from the copper substrate of a printed circuit board, the steps of:
   providing an aqueous solution of nitric acid in an amount sufficient to dissolve solder and tin, a source of ferric ions in an amount sufficient to dissolve tin-copper alloy, a source of halide ions in an amount sufficient to solubilize tin, and a source of ammonium ions in an amount sufficient, in combination with said halide ions, to solubilize said tin and substantially eliminate sludge formation, reduce attack on said copper substrate and provide a bright copper finish after solder removal; and
   applying the solution to the printed circuit board.

20. The method as defined in claim 19 including a material in the solution selected from the group consisting of benzotriazole, tolytriazole and combinations thereof in an amount not more than about 2% by weight of the liquid.

21. The method as defined in claim 20 including urea in the solution in an amount not more than about 2% by weight of the liquid.

22. The method as defined in claim 21 wherein the source of ammonium ions includes ammonium bicarbonate.

23. The method as defined in claim 19 wherein the source of halide ions is selected from the group consisting of HCl, HF, HBr, HI, NH$_4$Cl, FeCl$_3$, and combinations thereof.

24. The method as defined in claim 23 wherein the source of ammonium ions is selected from the group consisting of ammonium hydroxide, ammonium acetate, ammonium benzoate, ammonium bicarbonate, ammonium bifluoride, ammonium bitartrate, ammonium borate, ammonium bromide, ammonium carbamate, ammonium carbonate, ammonium ceric nitrate, ammonium chloride, ammonium citrate, ammonium cupric chloride, ammonium ferric citrate, ammonium ferric oxalate, ammonium ferric tartrate, ammonium fluoride, ammonium formate, ammonium iodide, ammonium lactate, ammonium nitrate, ammonium oxalate, ammonium salicylate, ammonium tartrate, urea, and combinations thereof.

25. The method as defined in claim 24 wherein the source of ferric ions is selected from the group consisting of ferric nitrate, ferric chloride, ferric acetate, ferric hydroxide, ferric lactate, ferric oxide and non sulfur bearing water soluble ferric salts of organic and inorganic nature.

26. In a method of stripping solder and the underlying tin-copper alloy from the copper substrate of a printed circuit board, the steps of:
providing a aqueous solution of about 25 to 45 weight percent of 67% nitric acid,
about 0.5 to 15 weight percent of a ferric ion source,
about 0.5 to 6 weight percent of a halide ion source, and
about 0.05 to 12 weight percent of an ammonium ion source; and
applying the solution to the printed circuit board.

27. The method as defined in claim 26 including a material in the solution selected from the group consisting of benzotriazole, tolytriazole and combinations thereof in an amount not more than about 2% by weight of the liquid.

28. The method as defined in claim 27 including urea in the solution in an amount not more than about 2% by weight of the liquid.

29. The method as defined in claim 28 wherein the source of ammonium ions includes ammonium bicarbonate.

30. The method as defined in claim 26 wherein the source of halide ions is selected from the group consisting of HCl, HF, HBr, HI, NH$_4$Cl, FeCl$_3$, and combinations thereof.

31. The method as defined in claim 30 wherein the source of ammonium ions is selected from the group consisting of ammonium hydroxide, ammonium acetate, ammonium benzoate, ammonium bicarbonate, ammonium bifluoride, ammonium bitartrate, ammonium borate, ammonium bromide, ammonium carbamate, ammonium carbonate, ammonium ceric nitrate, ammonium chloride, ammonium citrate, ammonium cupric chloride, ammonium ferric citrate, ammonium ferric oxalate, ammonium ferric tartrate, ammonium fluoride, ammonium formate, ammonium iodide, ammonium lactate, ammonium nitrate, ammonium oxalate, ammonium salicylate, ammonium tartrate, urea, and combinations thereof.

32. The method as defined in claim 31 wherein the source of ferric ions is selected from the group consisting of ferric nitrate, ferric chloride, ferric acetate, ferric hydroxide, ferric lactate, ferric oxide, and all non sulphur bearing water soluble ferric salts of organic and inorganic nature.

33. In a method of stripping solder and the underlying tin-copper alloy from the copper substrate of a printed circuit board, the steps of:
providing an aqueous solution of about 25 to 45 weight percent of 67% nitric acid aqueous solution, about 0.5 to 15 weight percent of 45% ferric nitrate aqueous solution, about 0.5 to 6 weight percent of a halide ion source, and about 0.05 to 12 weight percent of an ammonium ion source; and
applying the solution to the printed circuit board.

34. In a method of stripping solder and the underlying tin-copper from the copper substrate of a printed circuit board, the steps of:
providing an aqueous solution of about 30 to 35 weight percent of 67% nitric acid aqueous solution, about 5 to 10 weight percent of 45% ferric nitrate aqueous solution, about 0.5 to 2 weight percent of hydrochloric acid, and about 0.5 to 12 weight percent of ammonium bicarbonate; and
applying the solution to the printed circuit board.

35. The method as defined in claim 34 including about 0.05 to 2 weight percent of benzotriazole in the solution.

36. The method as defined in claim 35 including about 0.05 to 2 weight percent urea in the solution.

* * * * *